(12) United States Patent
Jain et al.

(10) Patent No.: US 11,501,185 B2
(45) Date of Patent: Nov. 15, 2022

(54) SYSTEM AND METHOD FOR REAL-TIME MODELING INFERENCE PIPELINE

(71) Applicant: Walmart Apollo, LLC, Bentonville, AR (US)

(72) Inventors: Mridul Jain, Cupertino, CA (US); Gajendra Alias Nishad Kamat, Cupertino, CA (US); Pawan Gupta, Bangalore (IN); Saurabh Agrawal, Bangalore (IN)

(73) Assignee: Walmart Apollo, LLC, Bentonville, AR (US)

( * ) Notice: Subject to any disclaimer, the term of this patent is extended or adjusted under 35 U.S.C. 154(b) by 961 days.

(21) Appl. No.: 16/262,830

(22) Filed: Jan. 30, 2019

(65) Prior Publication Data
US 2020/0242487 A1   Jul. 30, 2020

(51) Int. Cl.
| | | |
|---|---|---|
| *G06Q 30/02* | (2012.01) | |
| *G06N 5/04* | (2006.01) | |
| *G06N 20/00* | (2019.01) | |
| *H04L 43/08* | (2022.01) | |
| *G06F 30/20* | (2020.01) | |

(52) U.S. Cl.
CPC .............. *G06N 5/04* (2013.01); *G06F 30/20* (2020.01); *G06N 20/00* (2019.01); *H04L 43/08* (2013.01)

(58) Field of Classification Search
CPC .. G06Q 30/02; G06Q 10/067; G06Q 30/0254; G06Q 30/0246; G06Q 30/0207; G06N 5/04; G06N 20/00; G06F 30/20; H04L 43/08; H04L 41/147; H04L 41/145
See application file for complete search history.

(56) References Cited

U.S. PATENT DOCUMENTS

| | | | | |
|---|---|---|---|---|
| 7,720,873 B2* | 5/2010 | Loving | ................. | G06F 16/213 707/804 |
| 7,827,125 B1* | 11/2010 | Rennison | .............. | G06F 16/906 706/14 |
| 9,535,902 B1* | 1/2017 | Michalak | ............ | G06F 16/3331 |
| 2010/0057673 A1* | 3/2010 | Savov | ................... | G06F 16/258 707/E17.002 |

(Continued)

FOREIGN PATENT DOCUMENTS

JP    2019-532365 A   * 11/2019    ........... G06F 16/906

OTHER PUBLICATIONS

Ehrlinger, Lisa; Wob, Wolfram, A Survey of Data Quality Measurement and Monitoring Tools, Frontiers in Big Data, 5, 850611, Mar. 31, 2022 (Year: 2022).*

(Continued)

*Primary Examiner* — Marilyn G Macasiano
(74) *Attorney, Agent, or Firm* — Morgan, Lewis & Bockius LLP; Manita Rawat

(57) ABSTRACT

Systems and methods of real-time modeling pipeline inferencing are disclosed. At least one model configured to calculate at least one metric from one or more features is deployed. A model inferencing pipeline configured to extract the one or more features from a customer-specific data pipeline is implemented for the at least one mode. The model inferencing pipeline is generated using a training data set extracted from a cross-customer data pipeline. The at least one metric is calculated using the one or more features extracted from the customer-specific data pipeline.

20 Claims, 4 Drawing Sheets

(56) References Cited

U.S. PATENT DOCUMENTS

2016/0019244 A1* 1/2016 Liu ...................... G06F 16/212
707/695
2018/0052870 A1* 2/2018 Stojanovic ............ G06F 8/4452

OTHER PUBLICATIONS

Karthik B. Subramanya; Arun Somani, Enhanced feature mining and classifier models to predict customer churn for an E-retailer (English), 2017 7th International Conference on Cloud Computing, Data Science & Engineering. Confluence (pp. 531-536), Jan. 1, 2017 (Year: 2017).*

* cited by examiner

SYSTEM AND METHOD FOR REAL-TIME MODELING INFERENCE PIPELINE

TECHNICAL FIELD

This application relates generally to pipelines for data ingestion and, more particularly, to real-time model deployment within data pipelines.

BACKGROUND

Monitoring of data pipelines in networked environments, such as e-commerce or other networked environments allows for the collection and monitoring of network, system, and/or other health data, collecting and manipulation of metric data, querying of database metrics, and presentation of queried metrics in a usable and user-cognizable format. In order to monitor data pipelines, models must be designed to extract pipeline data, process the pipeline data, calculate one or more metrics, and output the calculated metrics to a user or user system.

Currently models and data connections to a pipeline for each model must be built manually for each desired metric within a shared user space (e.g., a shard). When a model is deployed, a model-specific pipeline must be built and hooked to the model. Building each model-specific pipeline is a hardware and time intensive task that requires large overhead. Additionally, construction of the pipeline is a technically intensive task that limits the number of individuals that are able to develop and deploy models to only those who are also able to build and generate model pipelines.

SUMMARY

In various embodiments, a system including a computing device is disclosed. The computing device is configured to deploy at least one model. The at least one model is configured to calculate at least one metric from one or more features. The computing device is further configured to implement a model inferencing pipeline configured to extract the one or more features from a customer-specific data pipeline. The model inferencing pipeline is generated using a training data set extracted from a cross-customer data pipeline. The computing system is configured to calculate the at least one metric using the one or more features extracted from the customer-specific data pipeline.

In various embodiments, a non-transitory computer readable medium having instructions stored thereon is disclosed. The instructions, when executed by a processor cause a device to perform operations including deploying at least one model configured to calculate at least one metric from one or more features and implementing a model inferencing pipeline configured to extract the one or more features from a customer-specific data pipeline. The model inferencing pipeline is generated using a training data set extracted from a cross-customer data pipeline. The instructions further cause the device to calculate the at least one metric using the one or more features extracted from the customer-specific data pipeline.

In various embodiments, a method is disclosed. The method includes steps of deploying at least one model configured to calculate at least one metric from one or more features and implementing a model inferencing pipeline configured to extract the one or more features from a customer-specific data pipeline. The model inferencing pipeline is generated using a training data set extracted from a cross-customer data pipeline. The at least one metric is calculated using the one or more features extracted from the customer-specific data pipeline.

BRIEF DESCRIPTION OF THE DRAWINGS

The features and advantages of the present invention will be more fully disclosed in, or rendered obvious by the following detailed description of the preferred embodiments, which are to be considered together with the accompanying drawings wherein like numbers refer to like parts and further wherein.

DETAILED DESCRIPTION

Figure 1:
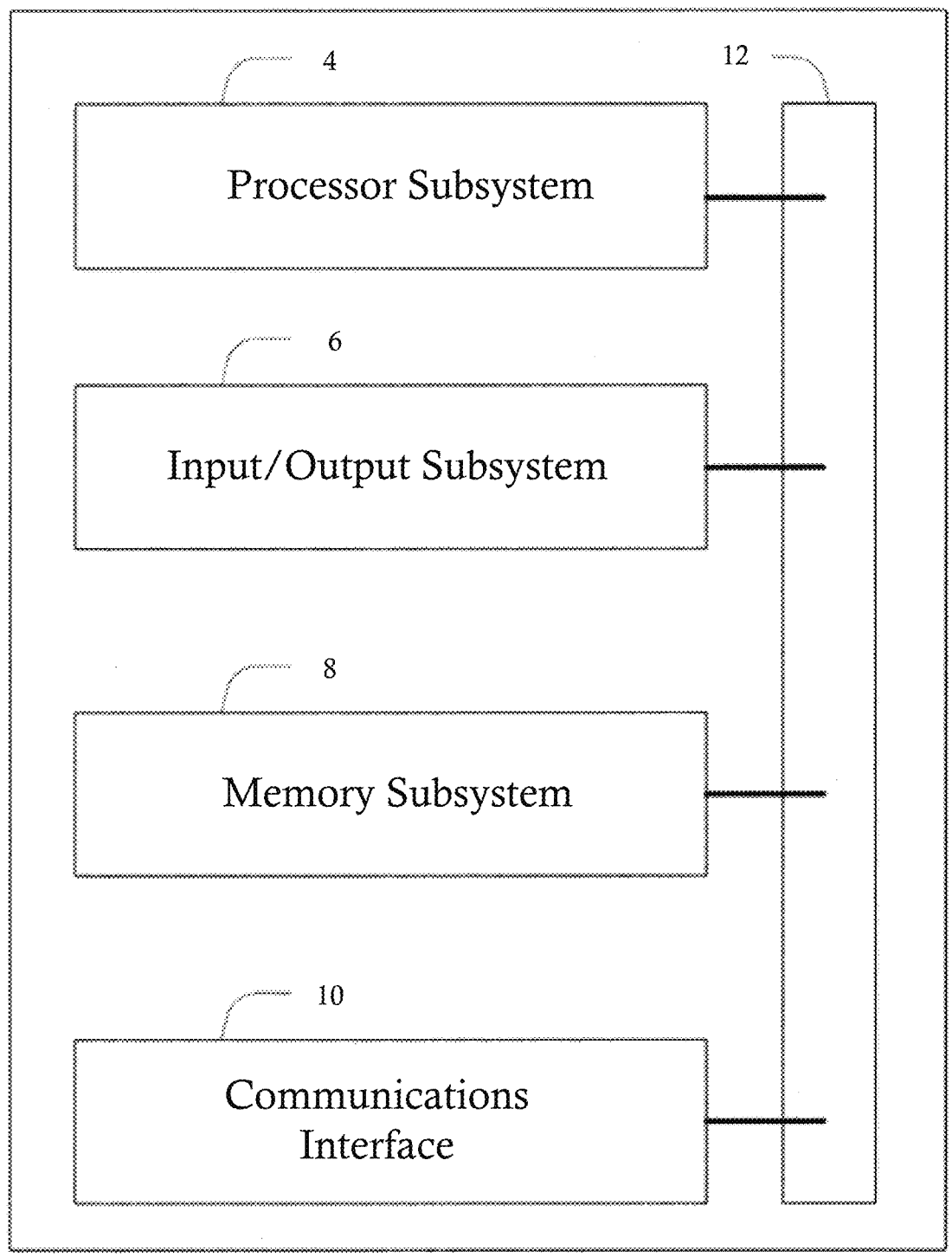
FIG. 1 illustrates a a block diagram of a computer system, in accordance with some embodiments.

The description of the preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In this description, relative terms such as "horizontal," "vertical," "up," "down," "top," "bottom," as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both moveable or rigid attachments or relationships, unless expressly described otherwise. The term "operatively coupled" is such an attachment, coupling, or connection that allows the pertinent structures to operate as intended by virtue of that relationship. In the claims, means-plus-function clauses, if used, are intended to cover structures described, suggested, or rendered obvious by the written description or drawings for performing the recited function, including not only structure equivalents but also equivalent structures.

In various embodiments, a model is generated and deployed to a user-associated core processing plane (CPP). The model is configured to calculate at least one metric based on one or more features contained within a data pipeline and associated with the user. A model inferencing pipeline is automatically generated and deployed to extract the one or more features from a customer-specific data pipeline and provide the features to the model. The model inferencing pipeline is automatically generated using a training data set extracted from a cross-customer data pipeline.

The at least one metric is calculated using the features extracted from the customer-specific data pipeline and are provided to a user.

FIG. 1 illustrates a computer system configured to implement one or more processes, in accordance with some embodiments. The system 2 is a representative device and may comprise a processor subsystem 4, an input/output subsystem 6, a memory subsystem 8, a communications interface 10, and a system bus 12. In some embodiments, one or more than one of the system 2 components may be combined or omitted such as, for example, not including an input/output subsystem 6. In some embodiments, the system 2 may comprise other components not combined or comprised in those shown in FIG. 1. For example, the system 2 may also include, for example, a power subsystem. In other embodiments, the system 2 may include several instances of the components shown in FIG. 1. For example, the system 2 may include multiple memory subsystems 8. For the sake of conciseness and clarity, and not limitation, one of each of the components is shown in FIG. 1.

The processor subsystem 4 may include any processing circuitry operative to control the operations and performance of the system 2. In various aspects, the processor subsystem 4 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor subsystem 4 also may be implemented by a controller, a microcontroller, an application specific integrated circuit (ASIC), a field programmable gate array (FPGA), a programmable logic device (PLD), and so forth.

In various aspects, the processor subsystem 4 may be arranged to run an operating system (OS) and various applications. Examples of an OS comprise, for example, operating systems generally known under the trade name of Apple OS, Microsoft Windows OS, Android OS, Linux OS, and any other proprietary or open source OS. Examples of applications comprise, for example, network applications, local applications, data input/output applications, user interaction applications, etc.

In some embodiments, the system 2 may comprise a system bus 12 that couples various system components including the processing subsystem 4, the input/output subsystem 6, and the memory subsystem 8. The system bus 12 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

In some embodiments, the input/output subsystem 6 may include any suitable mechanism or component to enable a user to provide input to system 2 and the system 2 to provide output to the user. For example, the input/output subsystem 6 may include any suitable input mechanism, including but not limited to, a button, keypad, keyboard, click wheel, touch screen, motion sensor, microphone, camera, etc.

In some embodiments, the input/output subsystem 6 may include a visual peripheral output device for providing a display visible to the user. For example, the visual peripheral output device may include a screen such as, for example, a Liquid Crystal Display (LCD) screen. As another example, the visual peripheral output device may include a movable display or projecting system for providing a display of content on a surface remote from the system 2. In some embodiments, the visual peripheral output device can include a coder/decoder, also known as Codecs, to convert digital media data into analog signals. For example, the visual peripheral output device may include video Codecs, audio Codecs, or any other suitable type of Codec.

The visual peripheral output device may include display drivers, circuitry for driving display drivers, or both. The visual peripheral output device may be operative to display content under the direction of the processor subsystem 6. For example, the visual peripheral output device may be able to play media playback information, application screens for application implemented on the system 2, information regarding ongoing communications operations, information regarding incoming communications requests, or device operation screens, to name only a few.

In some embodiments, the communications interface 10 may include any suitable hardware, software, or combination of hardware and software that is capable of coupling the system 2 to one or more networks and/or additional devices. The communications interface 10 may be arranged to operate with any suitable technique for controlling information signals using a desired set of communications protocols, services or operating procedures. The communications interface 10 may comprise the appropriate physical connectors to connect with a corresponding communications medium, whether wired or wireless.

Vehicles of communication comprise a network. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fibre Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 10 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 10 may comprise a wireless interface comprising one or more antennas, transmitters, receivers, transceivers, amplifiers, filters, control logic, and so forth.

In various aspects, the communications interface 10 may provide data communications functionality in accordance with a number of protocols. Examples of protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols (e.g., Bluetooth Specification versions 5.0, 6, 7, legacy Bluetooth protocols, etc.) as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in memory subsystem 8.

In some embodiments, the memory subsystem 8 may comprise any machine-readable or computer-readable media capable of storing data, including both volatile/non-volatile memory and removable/non-removable memory. The memory subsystem 8 may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the system 2.

In various aspects, the memory subsystem 8 may comprise any machine-readable or computer-readable media capable of storing data, including both volatile/non-volatile memory and removable/non-removable memory. For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory subsystem 8 may contain an instruction set, in the form of a file for executing various methods, such as methods including A/B testing and cache optimization, as described herein. The instruction set may be stored in any acceptable form of machine readable instructions, including source code or various appropriate programming languages. Some examples of programming languages that may be used to store the instruction set comprise, but are not limited to: Java, C, C++, C #, Python, Objective-C, Visual Basic, or .NET programming. In some embodiments a compiler or interpreter is comprised to convert the instruction set into machine executable code for execution by the processing subsystem 4.

Figure 2:
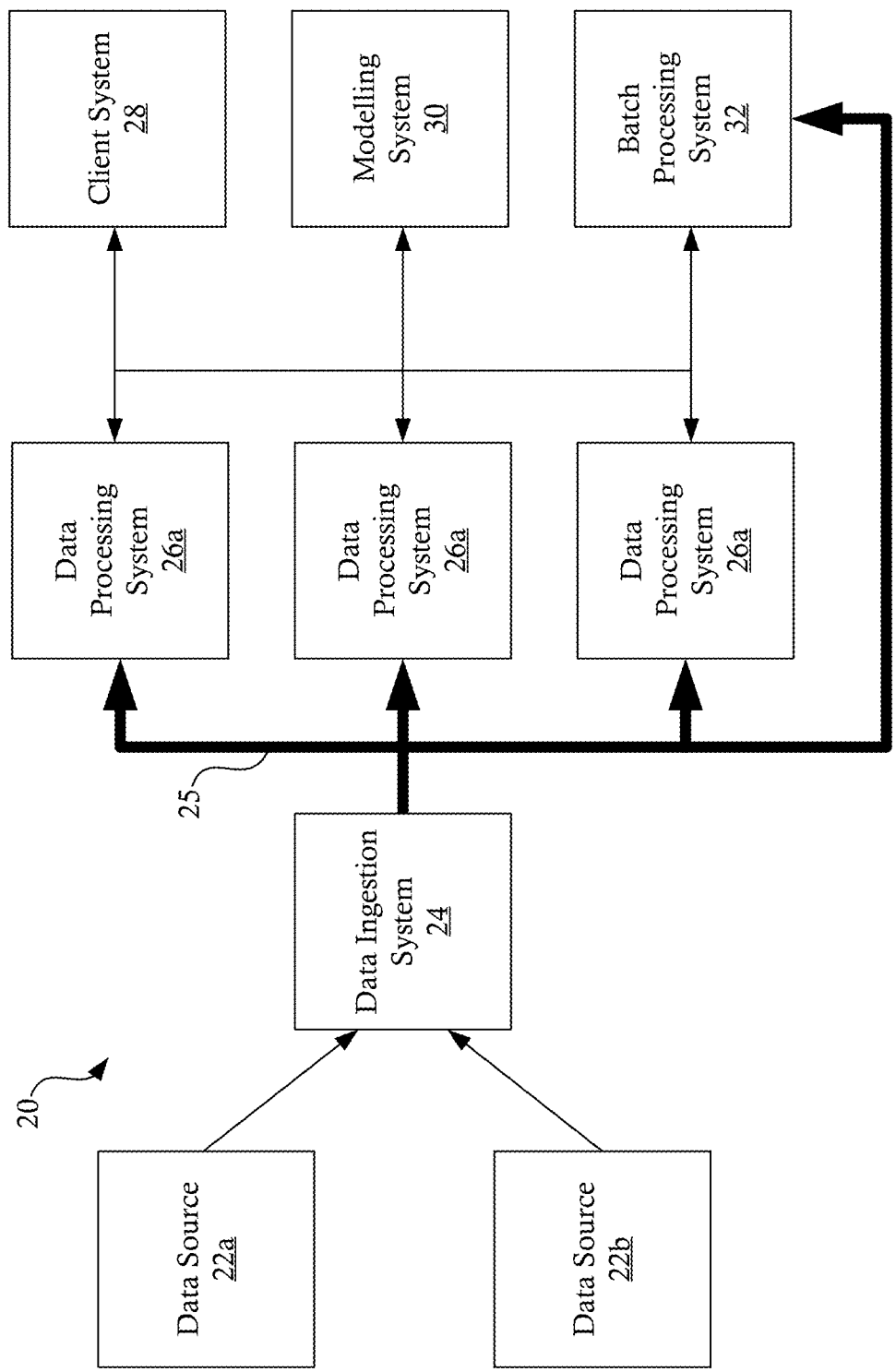
FIG. 2 illustrates a network configured to provide data ingestion and pipeline modeling, in accordance with some embodiments.

FIG. 2 illustrates a network 20 configured to provide real-time model generation and implementation, in accordance with some embodiments. The network 20 includes one or more data sources 22a, 22b configured to provide data input to a data ingestion system 24. The data ingestion system 24 aggregates the received data into a data pipeline 25, which is provided to one or more data processing systems 26a-26c each configured to implement one or more core processing planes (as discussed in greater detail below). A client system 28, a modelling system 30, and/or a batch processing system 32 may be configured to provide input to one or more data processing systems 26a-26c. Each of the systems 22-32 can include a system 2 as described above with respect to FIG. 1, and similar description is not repeated herein. Although the systems 22-32 are each illustrated as independent systems, it will be appreciated that each of the systems 22-32 may be combined, separated, and/or integrated into one or more additional systems. For example, in some embodiments, data ingestion system 24, one or more data processing system 26a-26c, client system 28, modelling system 30 and/or batch processing system 32 may be implemented by a shared server or shared network system. Similarly, the data source systems 22a, 22b may be implemented by a shared server or client system.

In some embodiments, each of the data processing system 26a-26c are configured to implement a core processing plane (CPP) configured to provide real-time model generation (e.g., configuration) and implementation (e.g., deployment). As discussed in greater detail below, each CPP is configured to receive one or more base models from one or more modelling systems 30. The base models may include complete models and/or partially-configurable models. In some embodiments, each data processing system 26a-26c is configured to receive at least one model from a modelling system 30 and deploy the model for real-time metric generation.

In some embodiments, the real-time models implemented by the data processing systems 26a-26c are configured to receive data input from the data ingestion system 24 and/or from a batch processing system 32. In some embodiments, the batch processing system 32 is configured to receive input from the data ingestion system 24 and preprocess data to generate cross-user pipelines, models, and/or metrics prior to ingestion of the data by the real-time model.

Figure 3:
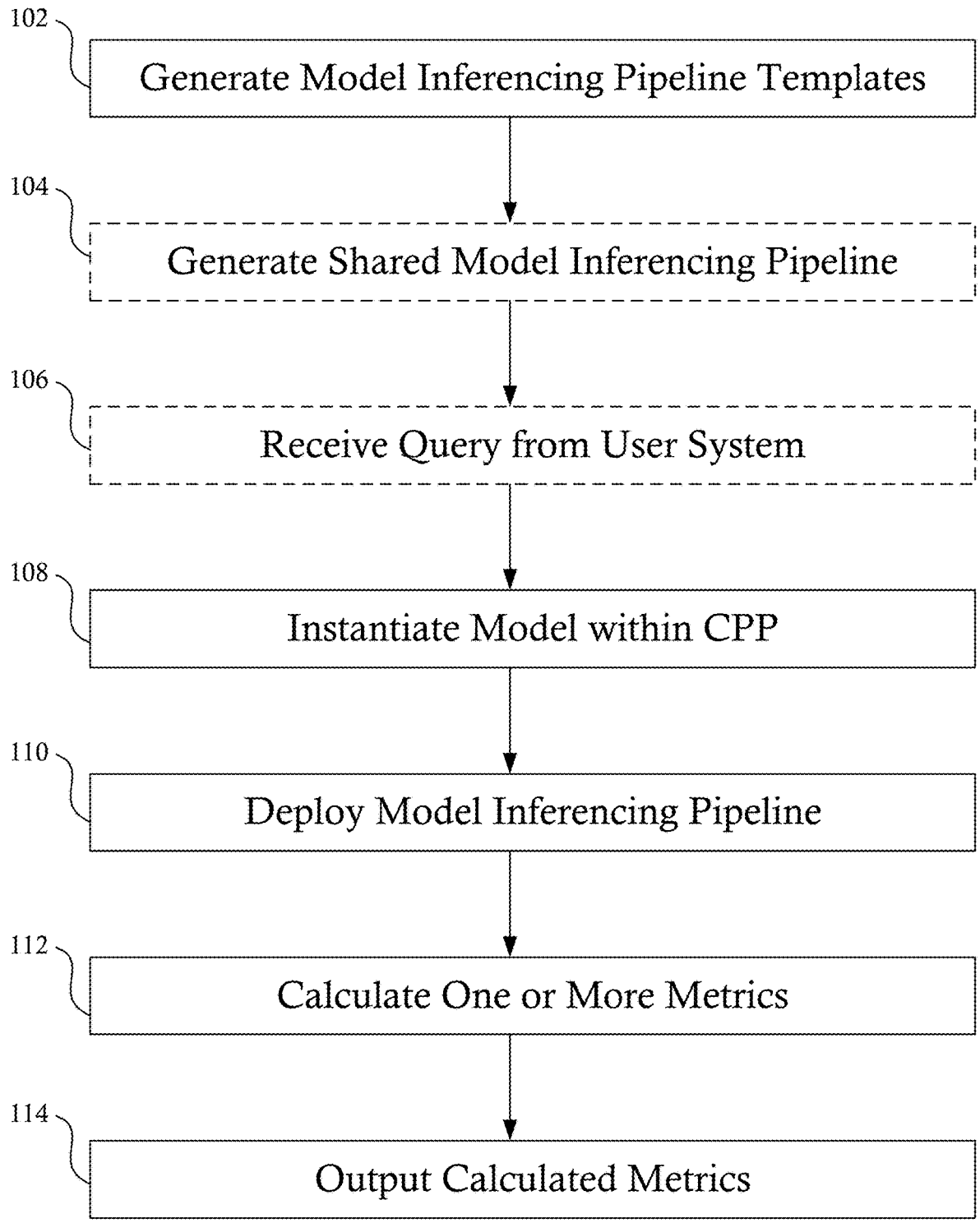
FIG. 3 is a flowchart illustrating a method of model generation and implementation, in accordance with some embodiments.
Figure 4:
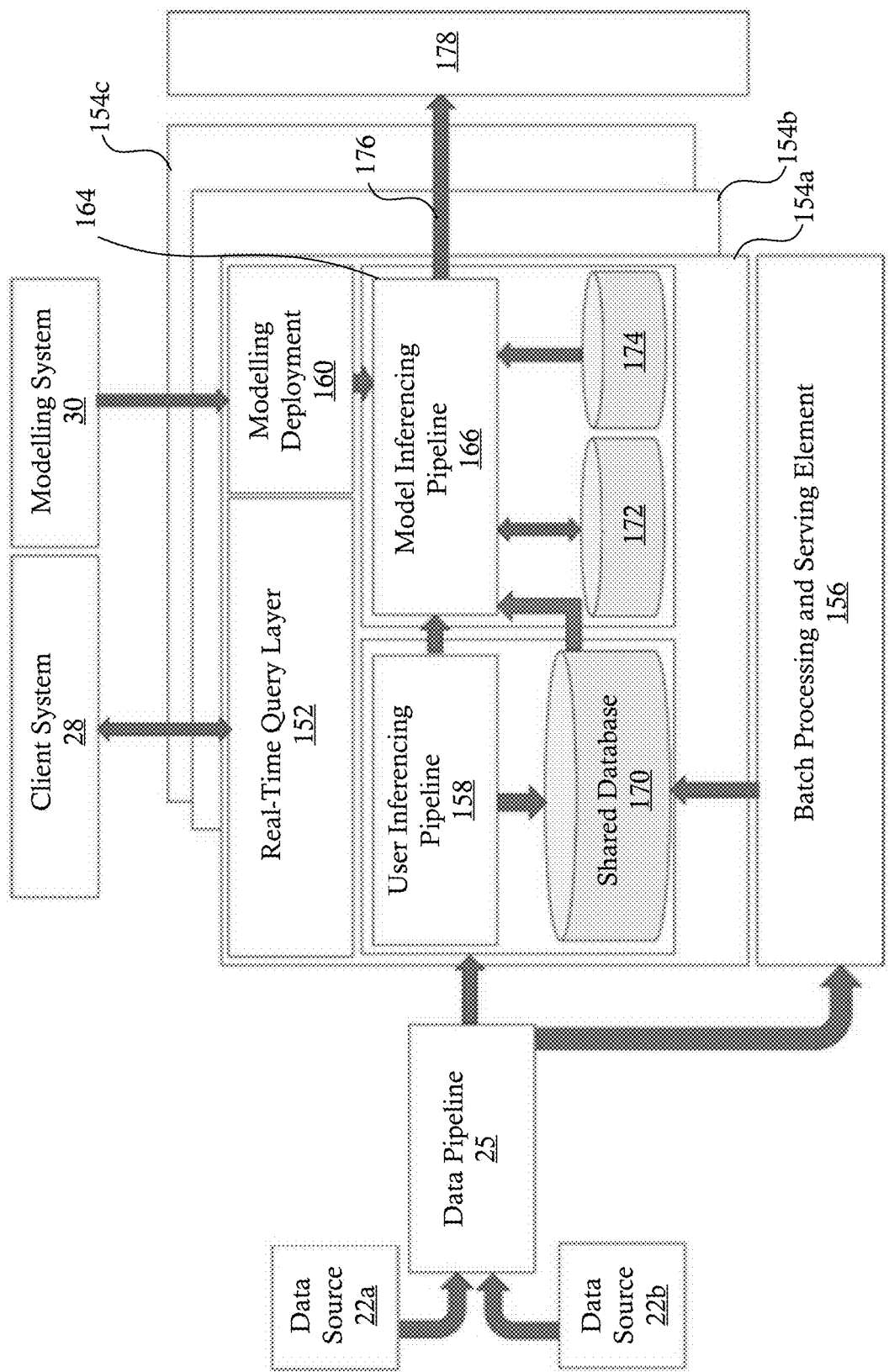
FIG. 4 illustrates a system flow during executing of the method of FIG. 3, in accordance with some embodiments.

FIG. 3 is a flowchart illustrating a method 100 of real-time model generation and implementation, in accordance with some embodiments. FIG. 4 illustrates a system flow 150 of various system elements during execution of the method 100, in accordance with some embodiments. The system 150 includes a data pipeline 25 that is configured to receive data input from a plurality of input source systems 22a, 22b. The data pipeline 25 may be generated by any suitable system, such as, for example, a data ingestion system 24. The system 150 further includes a plurality of real-time core processing planes (CPPs) 154a-154c each configured to provide real-time model generation and implementation for a predetermined set of client systems (e.g., customers). Input is provided from the data pipeline 25 to each of the CPPs 154a-154c. The CPPs 154a-154c may be implemented by one or more data processing system 26a-26c.

At step 102, a batch processing and serving element 156 generates one or more model inferencing pipeline templates. In some embodiments, the batch processing and serving element 156 receives data input from a data ingestion pipeline 152 and generates training data sets, validation data sets, and/or test data sets for one or more machine learning training processes from a set of cross-user, cross-group, and/or cross-shard data. The machine learning training processes are configured to receive one or more sets of data extracted from the data ingestion pipeline 25 and apply a learning process to generate one or more model inferencing pipeline templates configured to extract and provide a predetermined type, set, or collection of data from a data ingestion pipeline 25 to a model. The extracted data may be a specific type (e.g., scalar, vector, etc.), a specific category (e.g., count, price, etc.), and/or any other suitable category. The machine learning processes may include supervised and/or unsupervised learning processes. In some embodiments, the batch processing and serving element 156 generates the training data sets, validation data sets, and/or test data sets from data across multiple customer/user segments (or shards). The generated model inferencing pipeline templates may be stored in a database 170.

At optional step 104, a user inferencing pipeline 158 is generated and deployed within a CPP 154a. The user inferencing pipeline 158 includes user-specific and/or user-associated data from the data pipeline 25. In some embodiments, the user inferencing pipeline 158 includes one or more operators configured to extract one or more features shared across multiple models, CPPs, and/or systems. For example, in some embodiments, the user inferencing pipeline 158 may be configured to extract a scalar, vector, and/or other metric from the data ingestion pipeline 152 that is shared by two or more models 164 deployed within a CPP 154a associated with a first user. The extracted shared metrics may be stored in a database 170 that is reproduced and/or shared across multiple models 164 and/or CPPs 154a-154c.

At optional step 106, a query is received from a client system 28. The query may include a plurality of query parameters including, but not limited to, parameters regarding data of interest, desired output form, models to be used, and/or other parameters of the query. In some embodiments, the query is received by a real-time query layer 152 implemented by a CPP 154a associated with the client system 28. In some embodiments, the real-time query layer 152 provides an interface, such as an application programming interface (API) configured to guide input of query parameters and extract metrics from one or more models deployed in a CPP 154a-154c.

At step 108, a model 164 is instantiated within the CPP 154a. In some embodiments, a model deployment element 160 maintains one or more model templates and/or complete models that may be deployed within the CPP 154a such as, for example, models selected for a client group associated with the CPP 154a. The model templates and models may be generated, for example, by a modelling system 30 and uploaded to a model store accessible by the model deployment element 160. In some embodiments, the model store includes a representational state transfer (REST) end point.

In some embodiments, the model is deployed in response to one or more triggers, such as, for example, an event received from the data pipeline 25, a periodic trigger, and/or any other predetermined trigger. In some embodiments, the model and/or the triggers may be specified by one or more query parameters and/or inferred from one or more query parameters received in a user query. Although step 108 is illustrated as occurring after step 106, it will be appreciated that a model 164 may be deployed within the CPP 154a prior to receiving a query from a client system 28 related to that model.

In some embodiments, one or more models may be generated using data provided by the batch processing and serving element 156. For example, in some embodiments, the batch processing and serving element 156 may generate training data sets, validation data sets, and/or testing data sets including features extracted from the data pipeline 152 for generation and validation of one or more models. The model-generation data sets may be provided from the batch processing and serving element 156 to a modelling system 30. The modelling system 30 may apply one or more machine learning processes to generate client profiles, client-specific models, prediction models, and/or any other suitable model.

The model 164 includes a model inference pipeline 166 which, at step 110, is automatically generated and deployed by the CPP 154a (e.g., by a system instantiating the CPP 154a) based on one or more model inference pipeline templates generated by and/or machine learning processes implemented by the batch processing and servicing element 156. The model inferencing pipeline 166 is configured to provide real-time costumer-specific features and/or other data to the model 164. The model inferencing pipeline 166 extracts and processes (e.g., cleans data from the user inference pipeline 158. For example, in various embodiments, the model inferencing pipeline 166 may provide one or more operator providers configured to extract, process, and/or output features such as, for example, a source operator provider, a sink operator provider, a map operator provider, and/or any other suitable operator provider.

In some embodiments, each model 164 includes a model datapack store 172 and/or a model hop-on store 174. The model datapack store 172 includes one or more model datapacks that are used by the model 164 and/or the inferencing pipeline 166. In some embodiments, the model datapack store 172 is a shared stored accessible by multiple models within a CPP 154a and/or across CPPs 154a-154c. Similarly, in some embodiments, the model hop-on store 174 may include a shared store accessible by multiple models within a CPP 154a and/or across CPPs 154a-154c that provides intermediate states and/or key values.

In some embodiments, the model inferencing pipeline 166 is automatically instantiated using a predetermined pipeline interface. For example, in various embodiments, a model may be generated in one or more languages and/or environments, such as Spark, TensorFlow, etc. When a model is deployed to a CPP 154a-154c, the model deployment element 160 instantiates a model inference pipeline 166 in a predetermined pipeline interface, such as Streaming Spark and, if necessary, a conversion element is configured to convert data from the predetermined pipeline interface a form suitable for ingestion and use by the model 160. The automatically generated model inferencing pipeline 166 and conversion element provides language agnostic pipeline generation.

In some embodiments, one or more features are provided to model 164 from a database 170. For example, in some embodiments, one or more features shared across multiple models 164 and/or customers may be extracted by a shared inferencing pipeline 158 and stored in the database 170, as discussed above with respect to step 104. In some embodiments, one or more features may include one or more historic features, aggregations, and/or other metrics calculated by a second model (not shown). The one or more shared/historic features may be stored in the database 170 and/or provided directly to the model 164.

At step 112, the model 164 calculates one or more metrics. The calculated metric(s) may include any suitable metric, such as, for example, a count, average, mean, aggregate, value, etc. At step 114, the one or more metrics are provided as an output 176 to one or more suitable systems, such as, for example, a publication/subscription system 178. In some embodiments, the publication/subscription system 178 provides the one or more metrics to systems that are subscribed to specific CPPs 154a-154c and/or models 164, such as, for example, the client system 28.

In some embodiments, a post-processing pipeline may be deployed separately from and/or integrated with the model inferencing pipeline 166. The post-processing pipeline is configured to perform one or more post-processing functions on the generated metrics. For example, in some embodiments, the post-processing pipeline is configured to generate specific output forms, such as a hypercube, using the metrics generated by the model 164.

In some embodiments, the system and method illustrated in FIGS. 3-4 provide up to an 80% reduction in hardware load for generation and deployment of models. Additionally, the use of automatically generated model inferencing pipelines 166 allows feature extraction to be offloaded to the platform, reducing time requirements for generating and implementing models.

Although the subject matter has been described in terms of exemplary embodiments, it is not limited thereto. Rather, the appended claims should be construed broadly, to include other variants and embodiments, which may be made by those skilled in the art.

What is claimed is:

1. A system, comprising a computing device configured to:
    generate a training data set based on cross-customer data from a cross-customer data pipeline;
    apply a machine learning process using the training data set to generate one or more model inferencing pipeline templates;
    deploy at least one model configured to calculate at least one metric from one or more features;
    implement, based on the one or more model inferencing pipeline templates, a model inferencing pipeline configured to extract the one or more features from a customer-specific data pipeline; and
    calculate the at least one metric using the one or more features extracted from the customer-specific data pipeline.

2. The system of claim 1, wherein the computing device is configured to:
    implement a shared pipeline configured to extract one or more shared features from the cross-customer data pipeline;
    store the one or more shared features in a database; and
    provide the one or more shared features to the at least one model, wherein the at least one model calculates the at least one metric using the one or more shared features.

3. The system of claim 1, wherein the computing device is configured to:
    generate the at least one model from a set of model training data extracted from the cross-customer data pipeline; and
    provide the at least one model to a model store, wherein the at least one model is deployed from the model store.

4. The system of claim 3, wherein the computing device is configured to receive at least one query including one or more query parameters, wherein the at least one model is deployed in response to at least one of the one or more query parameters.

5. The system of claim 1, wherein the at least one model is deployed in response to a predetermined trigger received in the customer-specific data pipeline.

6. The system of claim 1, wherein the model inferencing pipeline is implemented using a predetermined pipeline environment and the model is deployed using a predetermined model environment, and wherein the computing device is configured to convert an output from the predetermined pipeline environment to an input suitable for the predetermined model environment.

7. The system of claim 1, wherein the computing device is configured to output the at least one metric to a publication/subscription element.

8. A non-transitory computer readable medium having instructions stored thereon, wherein the instructions, when executed by a processor cause a device to perform operations comprising:
    generating a training data set based on cross-customer data from a cross-customer data pipeline;
    applying a machine learning process using the training data set to generate one or more model inferencing pipeline templates;
    deploying at least one model configured to calculate at least one metric from one or more features;
    implementing, based on the one or more model inferencing pipeline templates, a model inferencing pipeline configured to extract the one or more features from a customer-specific data pipeline; and calculating the at least one metric using the one or more features extracted from the customer-specific data pipeline.

9. The non-transitory computer readable medium of claim 8, wherein the instructions, when executed by the processor cause the device to perform operations comprising:
implementing a shared pipeline configured to extract one or more shared features from the cross-customer data pipeline;
storing the one or more shared features in a database; and
providing the one or more shared features to the at least one model, wherein the at least one model calculates the at least one metric using the one or more shared features.

10. The non-transitory computer readable medium of claim 8, wherein the instructions, when executed by the processor cause the device to perform operations comprising:
generating the at least one model from a set of model training data extracted from the cross-customer data pipeline; and
providing the at least one model to a model store, wherein the at least one model is deployed from the model store.

11. The non-transitory computer readable medium of claim 10, wherein the instructions, when executed by the processor cause the device to perform operations comprising receiving at least one query including one or more query parameters, wherein the at least one model is deployed in response to at least one of the one or more query parameters.

12. The non-transitory computer readable medium of claim 8, wherein the at least one model is deployed in response to a predetermined trigger received in the customer-specific data pipeline.

13. The non-transitory computer readable medium of claim 8, wherein the model inferencing pipeline is implemented using a predetermined pipeline environment and the model is deployed using a predetermined model environment, and wherein the computing device is configured to convert an output from the predetermined pipeline environment to an input suitable for the predetermined model environment.

14. The non-transitory computer readable medium of claim 8, wherein the instructions, when executed by the processor cause the device to perform operations comprising outputting the at least one metric to a publication/subscription element.

15. A method, comprising:
generating a training data set based on cross-customer data from a cross-customer data pipeline;
applying a machine learning process using the training data set to generate one or more model inferencing pipeline templates;
deploying at least one model configured to calculate at least one metric from one or more features;
implementing, based on the one or more model inferencing pipeline templates, a model inferencing pipeline configured to extract the one or more features from a customer-specific data pipeline; and
calculating the at least one metric using the one or more features extracted from the customer-specific data pipeline.

16. The method of claim 15, comprising:
implementing a shared pipeline configured to extract one or more shared features from the cross-customer data pipeline;
storing the one or more shared features in a database; and
providing the one or more shared features to the at least one model, wherein the at least one model calculates the at least one metric using the one or more shared features.

17. The method of claim 15, comprising:
generating the at least one model from a set of model training data extracted from the cross-customer data pipeline; and
providing the at least one model to a model store, wherein the at least one model is deployed from the model store.

18. The method of claim 17, comprising receiving at least one query including one or more query parameters, wherein the at least one model is deployed in response to at least one of the one or more query parameters.

19. The method of claim 15, wherein the at least one model is deployed in response to a predetermined trigger received in the customer-specific data pipeline.

20. The method of claim 15, wherein the model inferencing pipeline is implemented using a predetermined pipeline environment and the model is deployed using a predetermined model environment, and wherein the computing device is configured to convert an output from the predetermined pipeline environment to an input suitable for the predetermined model environment.

* * * * *